(12) United States Patent
Stimpson et al.

(10) Patent No.: US 8,150,245 B2
(45) Date of Patent: Apr. 3, 2012

(54) SHOWER WATER HEATER

(75) Inventors: Robert William Stimpson, Douglas (GB); Yanchun Wang, Ballasalla (GB); James Edward Self, Colby (GB); Graham Jones, Blackpool (GB)

(73) Assignee: DLP Limited, Isle of Man, British Isles (GB)

( * ) Notice: Subject to any disclaimer, the term of this patent is extended or adjusted under 35 U.S.C. 154(b) by 771 days.

(21) Appl. No.: 12/296,127

(22) PCT Filed: Mar. 15, 2007

(86) PCT No.: PCT/GB2007/000893
§ 371 (c)(1),
(2), (4) Date: Nov. 4, 2008

(87) PCT Pub. No.: WO2007/128951
PCT Pub. Date: Nov. 15, 2007

(65) Prior Publication Data
US 2009/0314358 A1 Dec. 24, 2009

(30) Foreign Application Priority Data

Apr. 7, 2006 (GB) .................................. 0607040.3
Feb. 21, 2007 (GB) .................................. 0703360.8
Feb. 28, 2007 (GB) .................................. 0703879.7

(51) Int. Cl.
*B05B 1/24* (2006.01)
(52) U.S. Cl. .................. 392/473; 392/465; 392/475
(58) Field of Classification Search .................. 392/465, 392/473, 475
See application file for complete search history.

(56) References Cited

U.S. PATENT DOCUMENTS 3,557,389 A * 1/1971 Scobey .............................. 4/524
(Continued)

FOREIGN PATENT DOCUMENTS

DE 900155 12/1953
(Continued)

OTHER PUBLICATIONS

International Search Report published Nov. 15, 2007 for PCT/GB2007/000893 filed Mar. 15, 2007 (U.S. Appl. No. 12/296,127 claims priority to this application).

(Continued)

*Primary Examiner* — Thor Campbell
(74) *Attorney, Agent, or Firm* — Martin Fleit; Paul D. Bianco; Fleit Gibbons Gutman Bongini & Bianco PL

(57) ABSTRACT

An electric shower water heater unit for connection to a water supply and a mains electricity supply comprises a housing having a shower water outlet to which a shower hose is connectable; an electric water heater housed in the housing and fluidly connectable to a water supply outlet of the water supply and electrically connectable to the mains electricity supply, the electric water heater supplying water to the shower water outlet of the housing; a user-operable controller (20) for controlling a temperature and a flow rate of water supplied to the shower water outlet of the housing, and a control circuit which is housed in the housing and which controls the electric water heater based on inputs received from the user-operable controller (20). The user-operable controller includes a touch-pressure sensitive element (40, 49) for pressing by a user and which is in communication with the control circuit. The control circuit only controls the electric water heater when a pressure imparted by a user pressing the touch-pressure sensitive element (40, 49) is equal to or greater than a predetermined value.

11 Claims, 15 Drawing Sheets

U.S. PATENT DOCUMENTS

| | | | |
|---|---|---|---|
| 4,713,525 A | 12/1987 | Eastep | |
| 5,437,003 A | 7/1995 | Blanco | |
| 6,264,121 B1 | 7/2001 | McClary | |
| 6,286,764 B1 | 9/2001 | Garvey et al. | |
| 6,351,603 B2 * | 2/2002 | Waithe et al. | 392/474 |
| 6,477,324 B1 * | 11/2002 | Sun | 392/482 |
| 6,574,426 B1 * | 6/2003 | Blanco, Jr. | 392/485 |
| 6,674,963 B2 | 1/2004 | Hadar | |
| 6,694,093 B2 * | 2/2004 | Morris et al. | 392/479 |
| 6,714,726 B1 * | 3/2004 | Mitani et al. | 392/467 |
| 6,826,357 B2 * | 11/2004 | Tommaso | 392/465 |
| 7,567,751 B2 * | 7/2009 | Fabrizio | 392/490 |
| 7,574,120 B2 * | 8/2009 | Patterson et al. | 392/441 |
| 7,903,956 B2 * | 3/2011 | Colburn et al. | 392/311 |

FOREIGN PATENT DOCUMENTS

| | | |
|---|---|---|
| DE | 2006562 | 8/1970 |
| DE | 10309004 | 9/2004 |
| DE | 102004018035 | 11/2005 |
| FR | 922138 | 12/1945 |
| FR | 2596214 | 9/1987 |
| GB | 943027 | 11/1963 |
| GB | 1532953 | 11/1978 |
| GB | 2052699 | 1/1981 |
| GB | 2087520 | 5/1982 |
| GB | 2090650 | 7/1982 |
| GB | 2204966 | 11/1988 |
| GB | 2224103 | 4/1990 |
| GB | 2254678 | 10/1992 |
| GB | 2263965 A | 8/1993 |
| GB | 2289323 | 11/1995 |
| GB | 2310032 | 8/1997 |
| GB | 2321098 A | 7/1998 |
| GB | 2331578 | 5/1999 |
| GB | 2341667 | 3/2000 |
| GB | 2355653 | 5/2001 |
| GB | 2390143 | 12/2003 |
| GB | 2424368 | 9/2006 |
| GB | 2426037 | 11/2006 |
| JP | 59086849 | 5/1984 |
| JP | 01314849 | 12/1989 |
| JP | 02166344 | 6/1990 |
| JP | 04064832 | 2/1992 |
| JP | 05344560 | 12/1993 |
| JP | 07154871 | 6/1995 |
| WO | WO 2006/119951 | 11/2006 |

OTHER PUBLICATIONS

British Search Report for Application No. GB0607040.3 date of search Feb. 14, 2007 (U.S. Appl. No. 12/296,127 claims priority to this application).

British Search Report for Application No. GB0703879.7 date of search Apr. 27, 2007 (U.S. Appl. No. 12/296,127 claims priority to this application).

Written Opinion published Oct. 7, 2008 for PCT/GB2007/000893 filed Mar. 15, 2007 (U.S. Appl. No. 12/296,127 claims priority to this application).

International Preliminary Report on Patentability published Oct. 8, 2008 for PCT/GB2007/000893 filed Mar. 15, 2007 (U.S. Appl. No. 12/296,127 claims priority to this application).

* cited by examiner

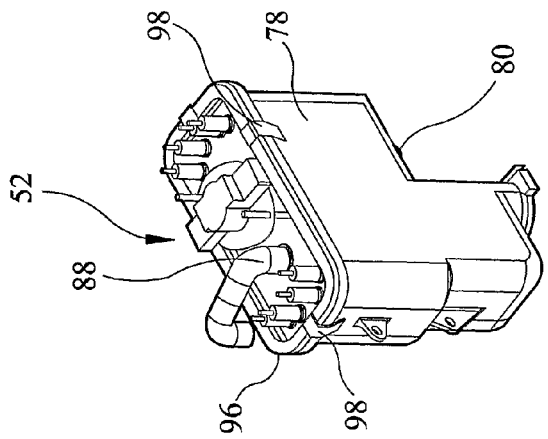
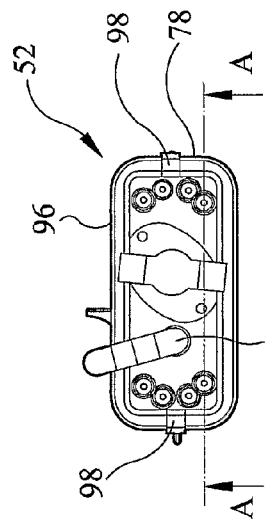
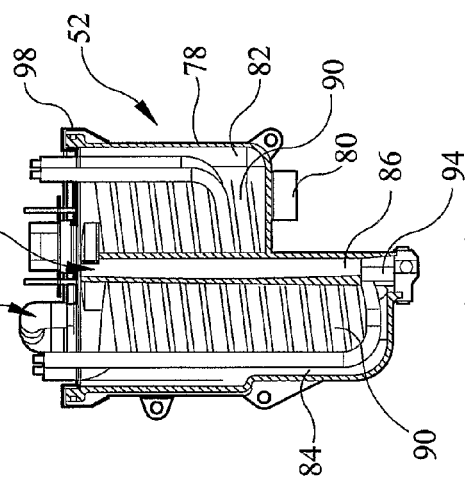
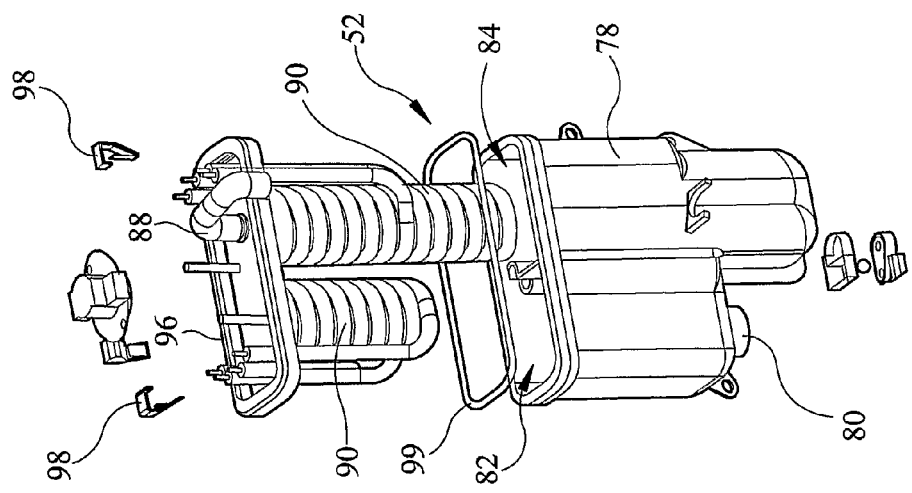

SHOWER WATER HEATER

FIELD OF THE INVENTION

The present invention relates to an electric shower water heater unit, an electric water heater for such a unit, a shower waste pump control system, and a shower having such a system.

BACKGROUND OF THE INVENTION

Traditionally, electric shower water heater units for domestic showering have been developed for operation by the able bodied person, typically for use when standing. This has meant that for a disabled or infirm user who needs to be seated when showering, the controls and adjustable features of the unit are often difficult to access, manipulate and/or are even beyond reach.

Independence is an essential feature of anyone's lifestyle, and is particularly important for those who have a disability or are infirm. Independence provides self-esteem, self-worth and boosts self-confidence. Bathing and washing are personal and private functions which are often difficult for the disabled. More often than not, a disabled or infirm person is expected to utilise equipment and resources which are either not adapted or are poorly adapted from those used by the able bodied.

SUMMARY OF THE INVENTION

It is therefore an object of this invention to provide improvements in and relating to electric showers which specifically address the needs of the disabled or infirm, in order to provide greater independence and ease of use than is presently possible with known electric showers.

According to a first aspect of the invention, there is provided an electric shower water heater unit for connection to a water supply and a mains electricity supply, the water heater unit comprising a housing having a shower water outlet to which a shower hose is connected or connectable; an electric water heater which is housed in the housing and which is fluidly connected or connectable to a water supply outlet of the water supply and electrically connected or connectable to the mains electricity supply, the electric water heater supplying water to the shower water outlet of the housing; a user-operable controller for controlling a temperature and a flow rate of water supplied to the shower water outlet of the housing, and a control circuit which is housed in the housing and which controls the electric water heater based on inputs received from the user-operable controller; the user-operable controller including a touch-pressure sensitive element for pressing by a user and which is in communication with the control circuit, the control circuit only controlling the electric water heater when a pressure imparted by a user pressing the touch-pressure sensitive element is equal to or greater than a predetermined value.

Preferable and/or optional features of the first aspect of the invention will be further apparent in accordance with the disclosure.

According to a second aspect of the invention, there is provided a shower comprising an electric shower unit for supplying water to a shower head, a waste water outlet unit which is in fluid communication with a drain and, when in use, through which waste water from the shower head flows, an electric pump for assisting the flow of waste water from the waste water outlet unit to the drain, a direct wired connection between the shower unit and the electric pump, and water flow rate determination means for determining water flow rate at the shower unit, a pumping rate of the electric pump being variably controllable based on an output from the water flow rate determination means through the direct wired connection.

Preferable and/or optional features of the second aspect of the invention will be further apparent in accordance with the disclosure.

According to a third aspect of the invention, there is provided an electric shower water heater unit for connection to a water supply and a mains electricity supply, the water heater unit comprising a housing having a wall mountable base and cover which is releasably engagable with the base; an electric water heater housed in the housing and connected or connectable to a water outlet of the water supply; a control circuit for controlling the electric water heater; and a two part electrical connector for supplying electricity to the electric water heater and the control circuit, the electrical connector having a base part which is provided in the housing and which is in electrical communication with the electric water heater and the control circuit, a top part which is connectable to cable conductors of a mains power supply cable and which is releasably engagable with the base part, and connector conductors via which, when the top part and base part are engaged, the top part and base part can electrically communicate, so that the electric water heater can be energised and controlled.

Preferable and/or optional features of the third aspect of the invention will be further apparent in accordance with the disclosure.

According to a fourth aspect of the invention, there is provided an electric shower water heater unit for connection to a water supply and a mains electricity supply, the water heater unit comprising a housing having a shower water outlet to which a shower hose is connected or connectable; an electric water heater which is housed in the housing and which is fluidly connected or connectable to a water supply outlet of the water supply and electrically connected or connectable to the mains electricity supply, the electric water heater supplying water to the shower water outlet of the housing; a user-operable controller for controlling a temperature and a flow rate of water supplied to the shower water outlet of the housing, and a control circuit which is housed in the housing and which controls the electric water heater based on inputs received from the user-operable controller; the user-operable controller being in wireless communication with the control circuit, so that a shower user or carer can control the electric water heater remotely.

Preferably, the user-operable controller is a waterproof personal device. Consequently, rather than being permanently surface mounted in a convenient place for the user, it can actually be held and used by the user while showering, preferably hung around the neck of the user as a pendant.

According to a fifth aspect of the invention, there is provided an electric water heater for an shower water heater unit, the electric water heater comprising a water heater housing having a water supply inlet, a water outlet, a first heating chamber in the housing and in fluid communication with the water supply inlet so as to initially receive inflowing water, a first electric heating element in the first heating chamber for heating water in the first heating chamber, a second heating chamber in the housing and in fluid communication with the water outlet so as to supply water to the water outlet, an elongate conduit by which the first and second heating chambers are in fluid communication and through which water flows from the first heating chamber to the second heating chamber, and a second electric heating element in the second heating chamber for heating water in the second heating chamber.

Preferable and/or optional features of the fourth aspect of the invention will be further apparent in accordance with the disclosure.

According to a sixth aspect of the invention, there is provided an electric shower water heater unit for connection to a water supply and a mains electricity supply, the water heater unit comprising a housing having a shower water outlet to which a shower hose is connected or connectable, a wall mountable base, and a cover which is releasably engagable with the base; an electric water heater which is housed in the housing and which is fluidly connected or connectable to a water supply outlet of the water supply and electrically connected or connectable to the mains electricity supply, the electric water heater supplying water to the shower water outlet of the housing; a user-operable controller for controlling a temperature and a flow rate of water supplied to the shower water outlet of the housing, and a control circuit which is housed in the housing and which controls the electric water heater based on inputs received from the user-operable controller; the cover and/or base including a watertight seal by which water is prevented from passing between the cover and the base and thus entering the water heater unit.

Preferably, the user-operable controller is mounted on the housing and is entirely sealed against water passing between the user-operable controller and the housing, so as to enter the heater unit.

According to a seventh aspect of the invention, there is provided an electric shower water heater unit for connection to a water supply and a mains electricity supply, the water heater unit comprising a housing having a shower water outlet to which a shower hose is connected or connectable; an electric water heater which is housed in the housing and which is fluidly connected or connectable to a water supply outlet of the water supply and electrically connected or connectable to the mains electricity supply, the electric water heater supplying water to the shower water outlet of the housing; a user-operable controller for controlling a temperature and a flow rate of water supplied to the shower water outlet of the housing, and a control circuit which is housed in the housing and which controls the electric water heater based on inputs received from the user-operable controller; the user-operable controller being mounted on the housing and entirely sealed against water passing between the user-operable controller and the housing, so as to enter the heater unit.

Preferably, the cover and/or base includes a watertight seal by which water is prevented from passing between the cover and the base and thus entering the water heater unit.

According to a eighth aspect of the invention, there is provided a shower waste pump control system comprising a transmitter which transmits a signal when a shower water supply unit is turned on, and a receiver which is in wireless communication with the transmitter and which causes an electric pump in fluid communication with a shower waste to operate when receiving the said signal from the transmitter.

According to a ninth aspect of the invention, there is provided a shower comprising an electric shower unit for supplying water to a shower head, a waste water outlet unit which is in fluid communication with a drain and, when in use, through which waste water from the shower head flows, an electric pump for assisting the flow of waste water from the waste water outlet unit to the drain, a transmitter which is provided in the electric shower unit and which outputs a signal when the electric shower unit is energised, and a receiver which is at the electric pump and which is in wireless communication with the transmitter, the receiver causing the electric pump to operate when receiving the said signal from the transmitter.

Preferable and/or optional features of the ninth aspect of the invention will be further apparent in accordance with the disclosure.

BRIEF DESCRIPTION OF THE DRAWINGS

The invention will now be more particularly described, by way of example only, with reference to the accompanying drawings, in which:

FIG. 11 is a perspective view from above of an electric water heater of the electric shower water heater unit, shown in FIG. 1;

FIG. 12 is a top plan view of the electric water heater;

FIG. 13 is a sectional side view of the electric water heater, taken along line A-A in FIG. 12;

FIG. 14 is an exploded perspective view of the electric water heater;

DETAILED DESCRIPTION OF THE INVENTION

Figure 1:
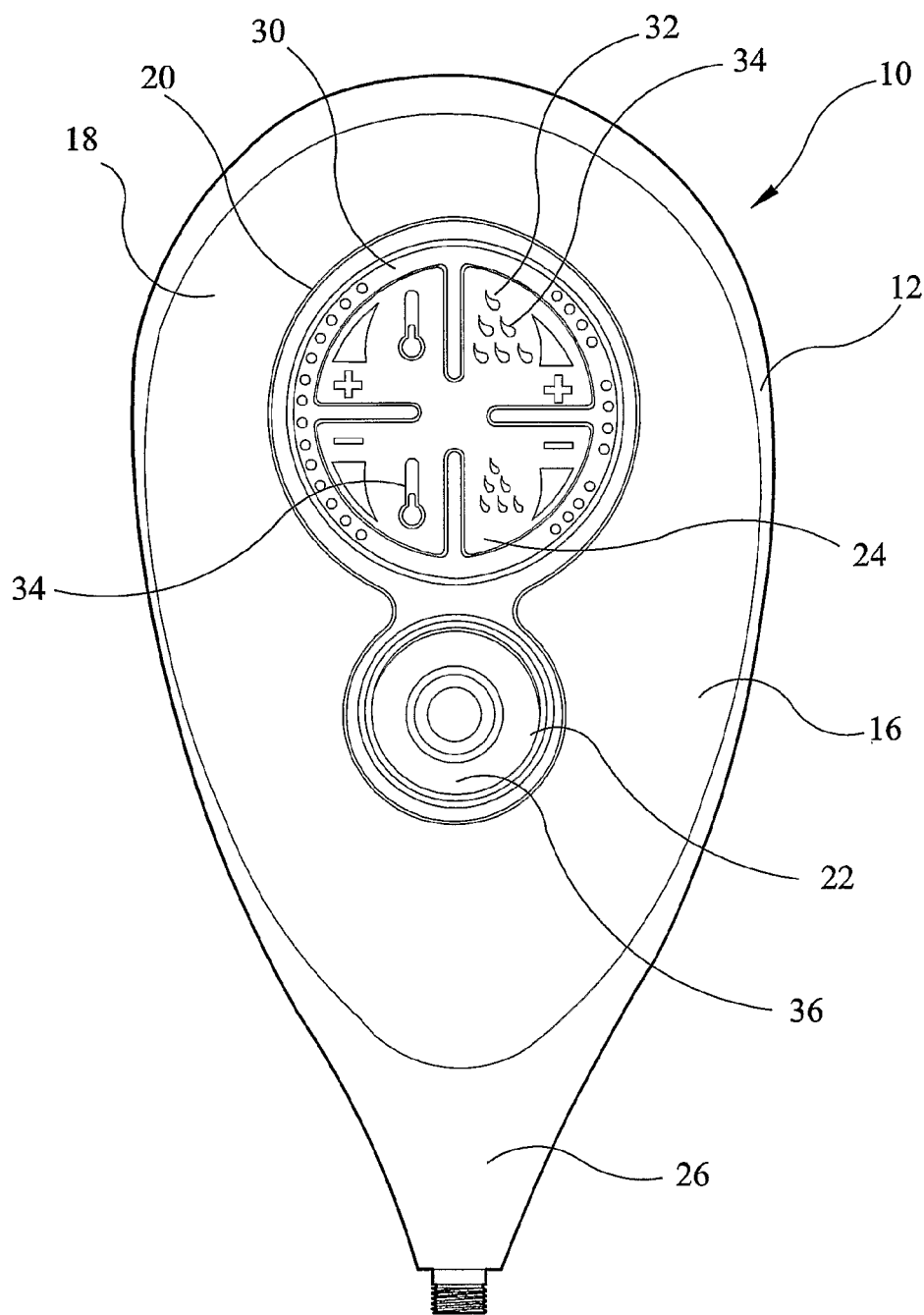
FIG. 1 is a front view of one embodiment of an electric shower water heater unit, in accordance with the present invention.
Figure 2:
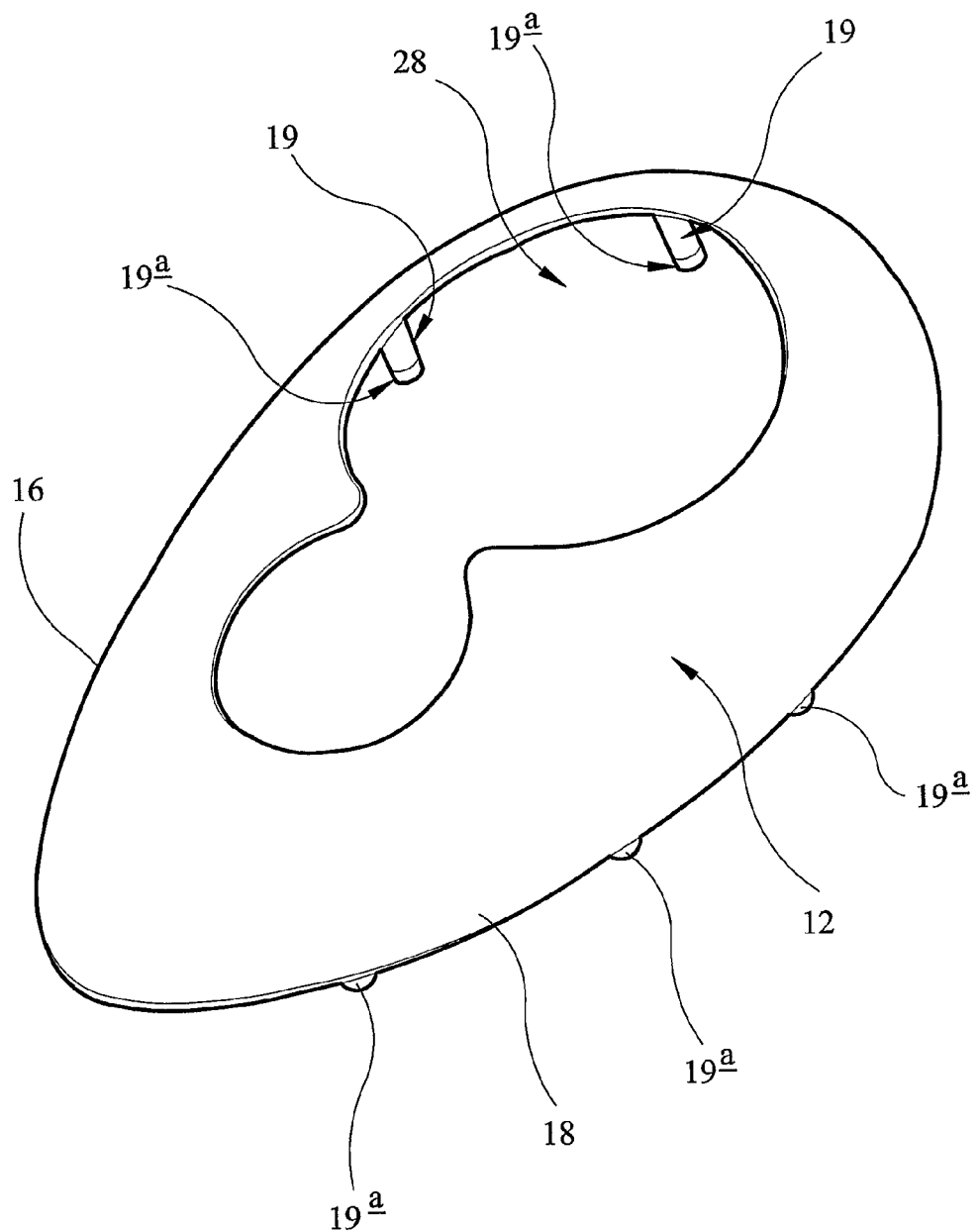
FIG. 2 is a perspective view of a first part of a cover of the electric shower water heater unit, shown in FIG. 1.
Figure 3:
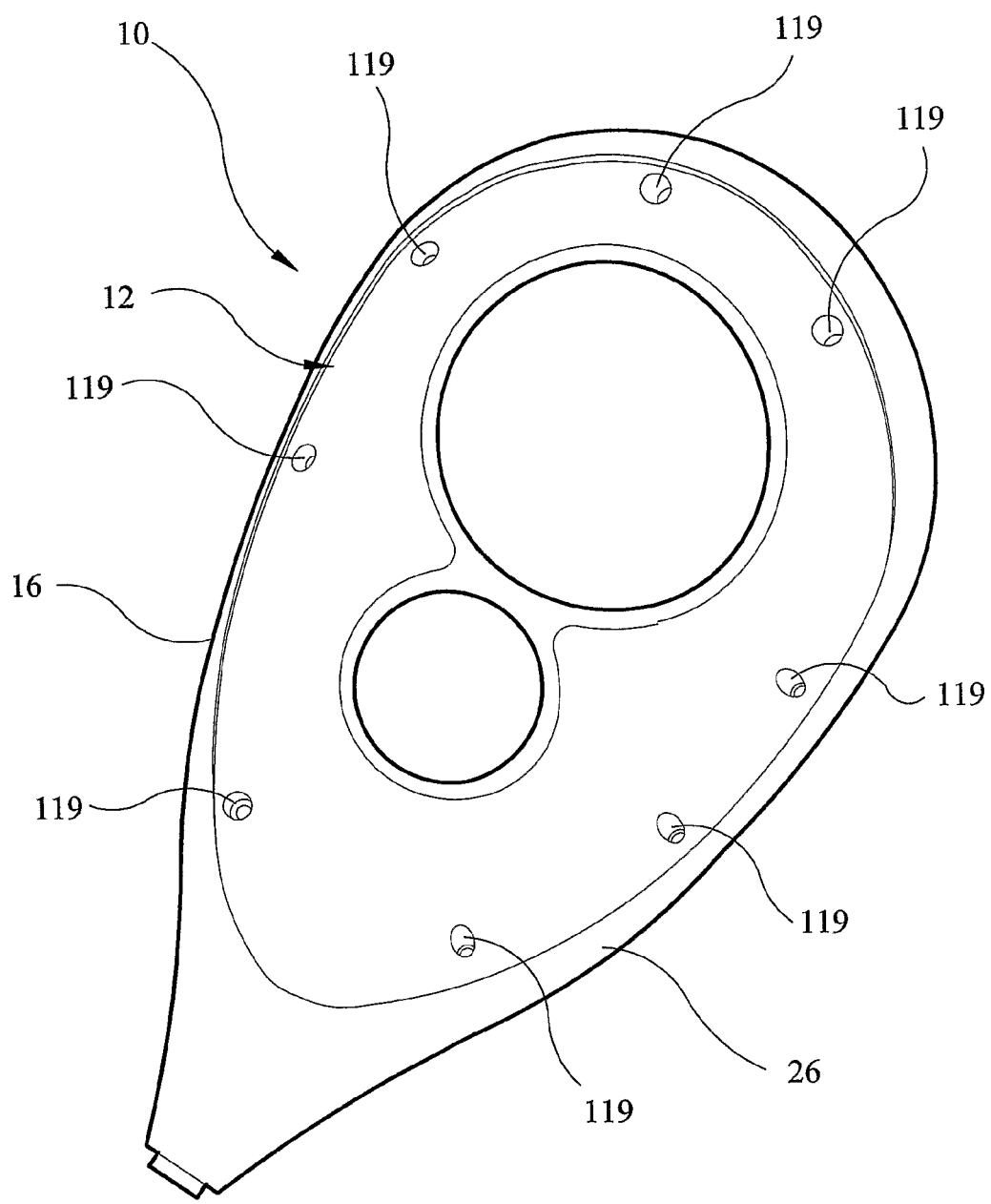
FIG. 3 is a front view of a second part of the cover of the electric shower water heater unit.

Referring to the drawings, there is shown an electric shower water heater unit 10 which comprises a tear-drop shaped housing 12 having a wall mountable base 14 and two part cover 16 which is releasably engagable with the base 14. The cover 16 has no flat or planar exterior surfaces, in order to prevent or limit reflection of light, which can disorientate a disabled or infirm user, especially one with sight problems.

A first part 18 of the two part cover 16 provides dual functions of both a cosmetic and water seal covering to a second part 26 of the cover 16 and includes locating posts 19 on the inner surface which contain sealing elements 19a. The sealing elements 19a are preferably injection moulded thermoplastic elastomers. When cosmetic first part 18 is assembled to the second part 26, the locating posts 19 enter complementarily shaped openings 119 formed in the second part 26 to cover base fixing screw recesses within projections 119. Thus the dual function of both retaining the cosmetic cover 16 and sealing the screw recesses from water ingress is performed. The first part 18 of the two part cover 16 is thus water-tightly sealed to the second larger part 26 of the two part cover 16, which interfaces with the base 14.

Figure 6:
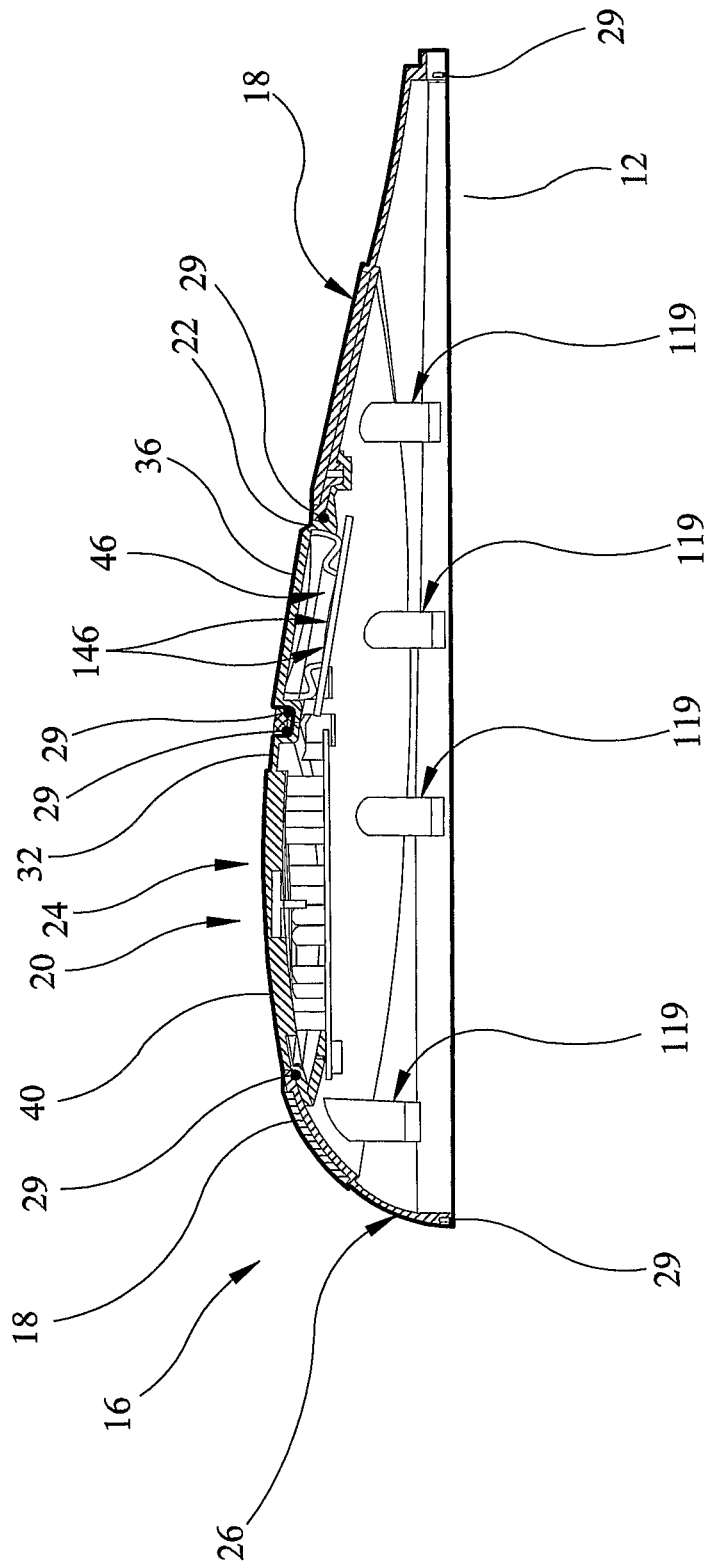
FIG. 6 is a vertical sectional view of the top cover of the electric shower water heater unit, shown in FIG. 1
Figure 19:
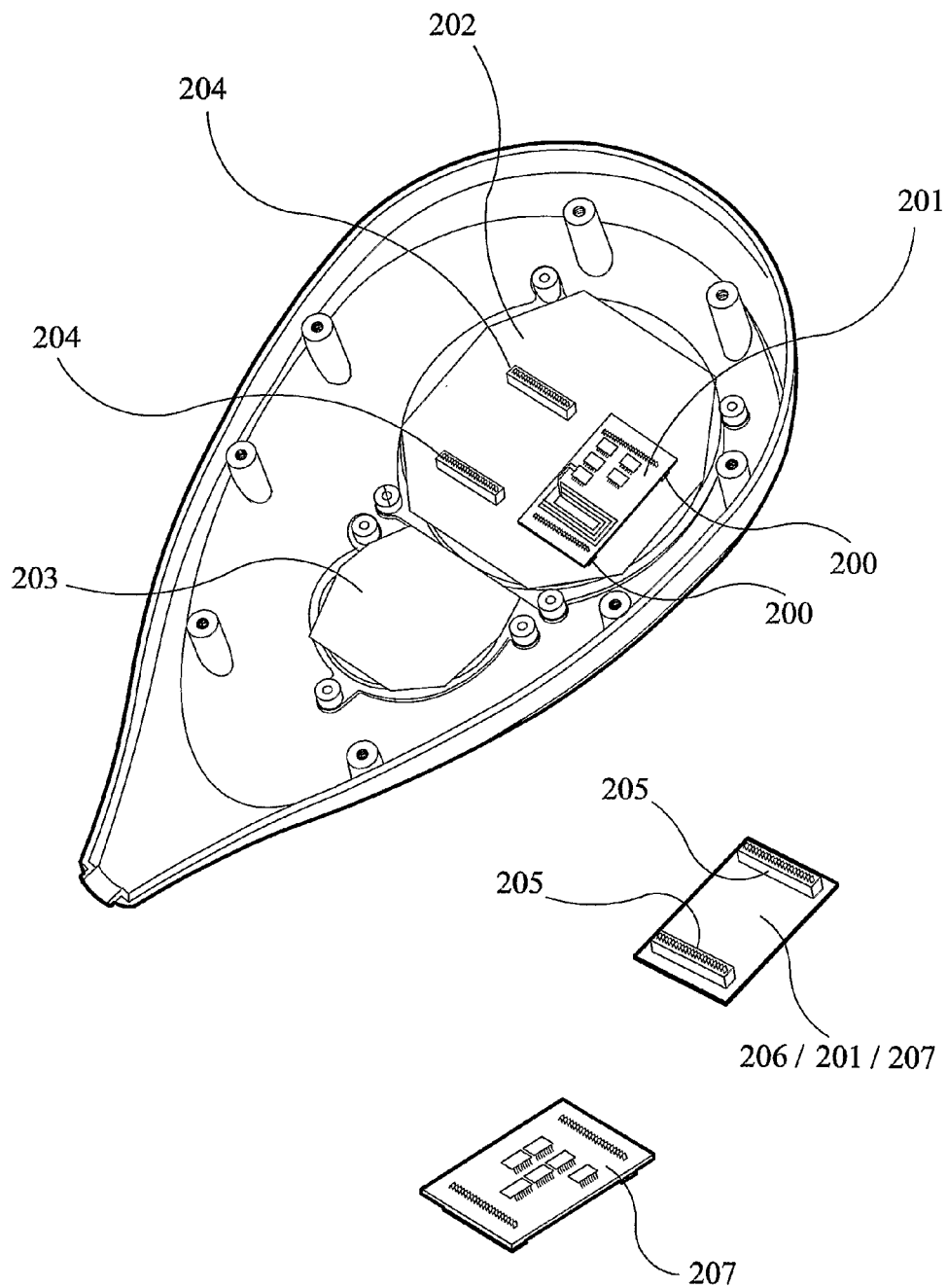
FIG. 19 is a reverse side view of the cover shown in FIG. 6, showing a control panel circuit.
Figure 20:
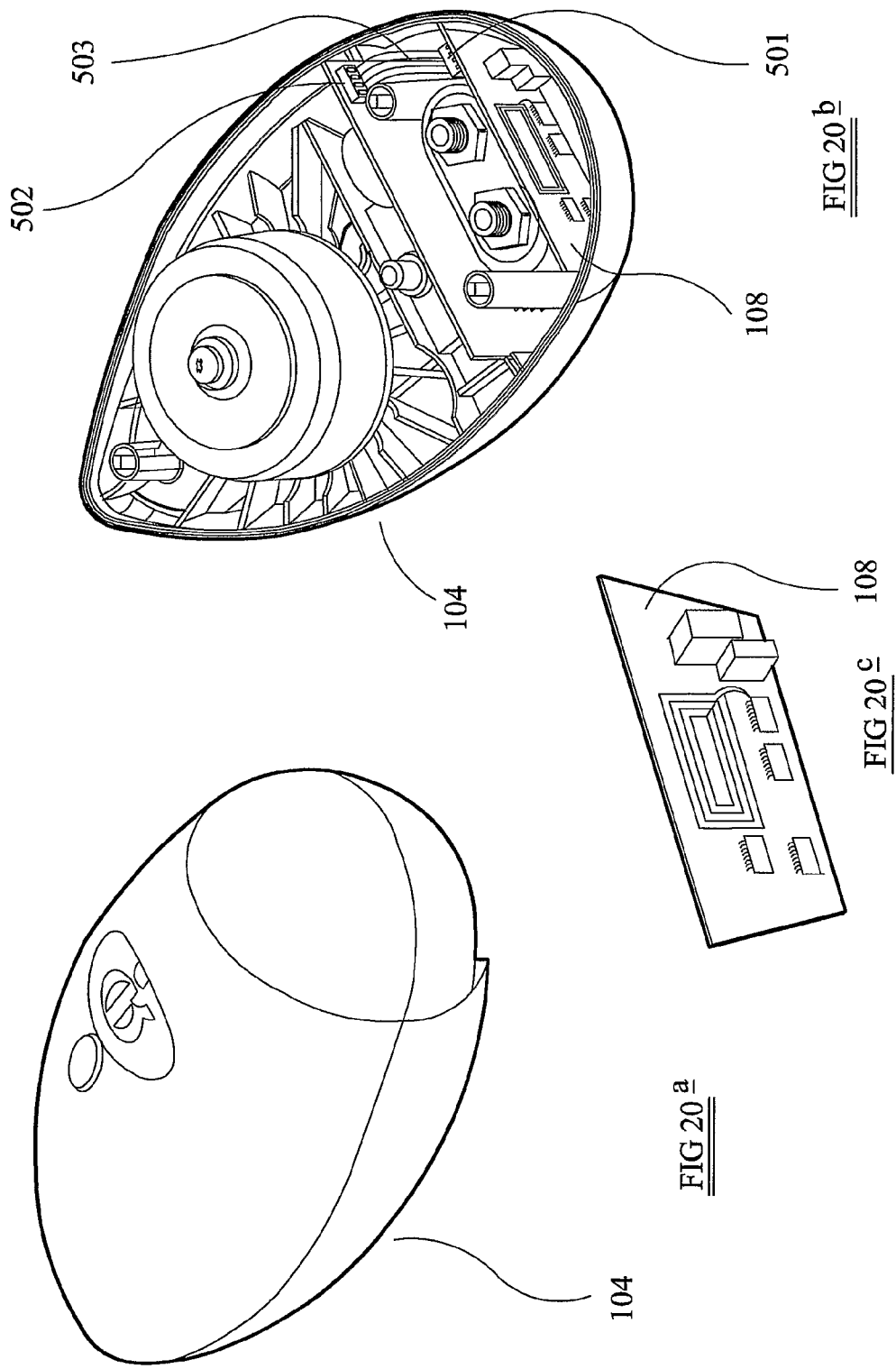
FIGS. 20a to 20c show a perspective view of a shower waste pump with cover in place, cover removed, and a receiver on a PCB which is mountable within a housing of the pump.

As best seen in FIGS. 6 and 19, the lower, second part cover 26 supports a user-operable controller 20, which comprises an ON/OFF power button 22, and a control panel 24. The second part 26 of the two part cover 16 and/or the base 14 also include one or more watertight seals 29 which prevent the ingress of water into the interior of the housing 12 from between the cover 16 and the base 14.

The power button 22 and the control panel 24 of the user-operable controller 20 are received in a matching opening 28 formed in the first part 18 of the two part cover 16. One or more seals 29 are again used and are interposed between the user-operable controller 20 and the second part 26 of the cover 16 to prevent the passage of water therebetween.

By the use of the above-mentioned seals, an IP65 water-tightness rating is achieved, which heretobefore has not been considered necessary by manufacturers of electric shower units. The present electric shower unit 10 can therefore be mounted in positions which heretobefore have not been possible or advisable. The seals allow the unit to be subjected to direct and continuous water spray for extended periods. Known electric shower units do not advise this.

This facility is particularly beneficial and essential to allow unrestricted installation location and subsequent use by wheel-chair users or use by those with poor limb control, which may give occasion for extensive flooding of the exterior of the casing by the shower spray by the user.

The user-operable controller 20 has a continuous surface 30 and a tactile feel. The controller 20 is large with prominent simplistic colourful push-button areas 32 to aid, for example, partially sighted users. Embossed symbols 34 can additionally or alternatively be supplied, with or without additional Braille embossing to aid partially-sighted or blind users.

Figure 5:
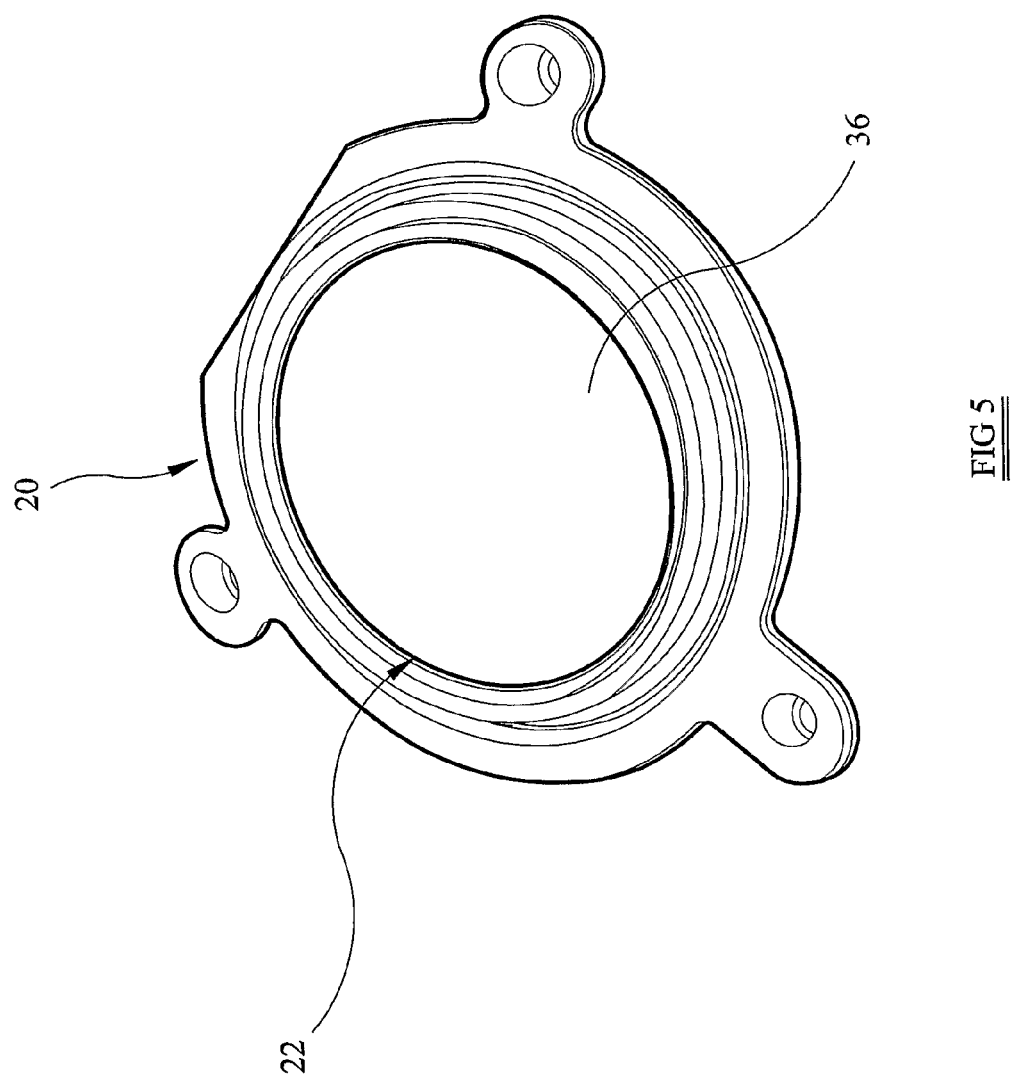
FIG. 5 is a perspective view from above of an ON/OFF power button of the electric shower water heater unit.
Figure 7:
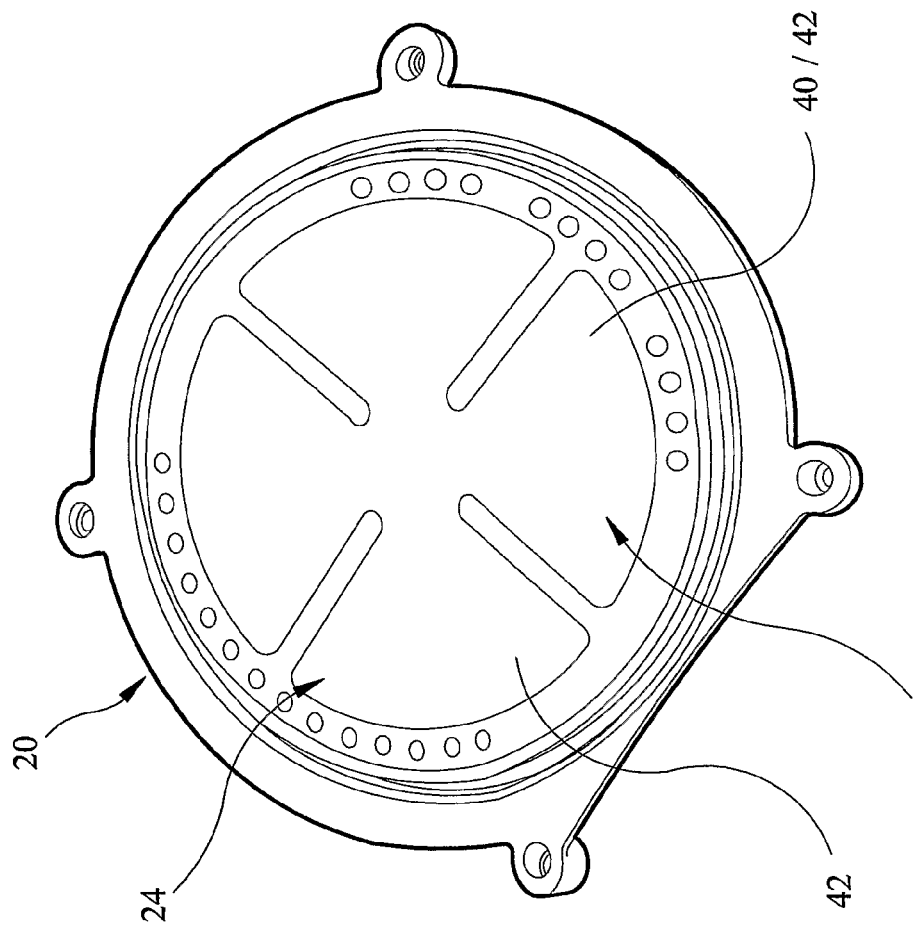
FIG. 7 is a perspective view from above of a user-operable control panel of the electric shower water heater unit.
Figure 8:
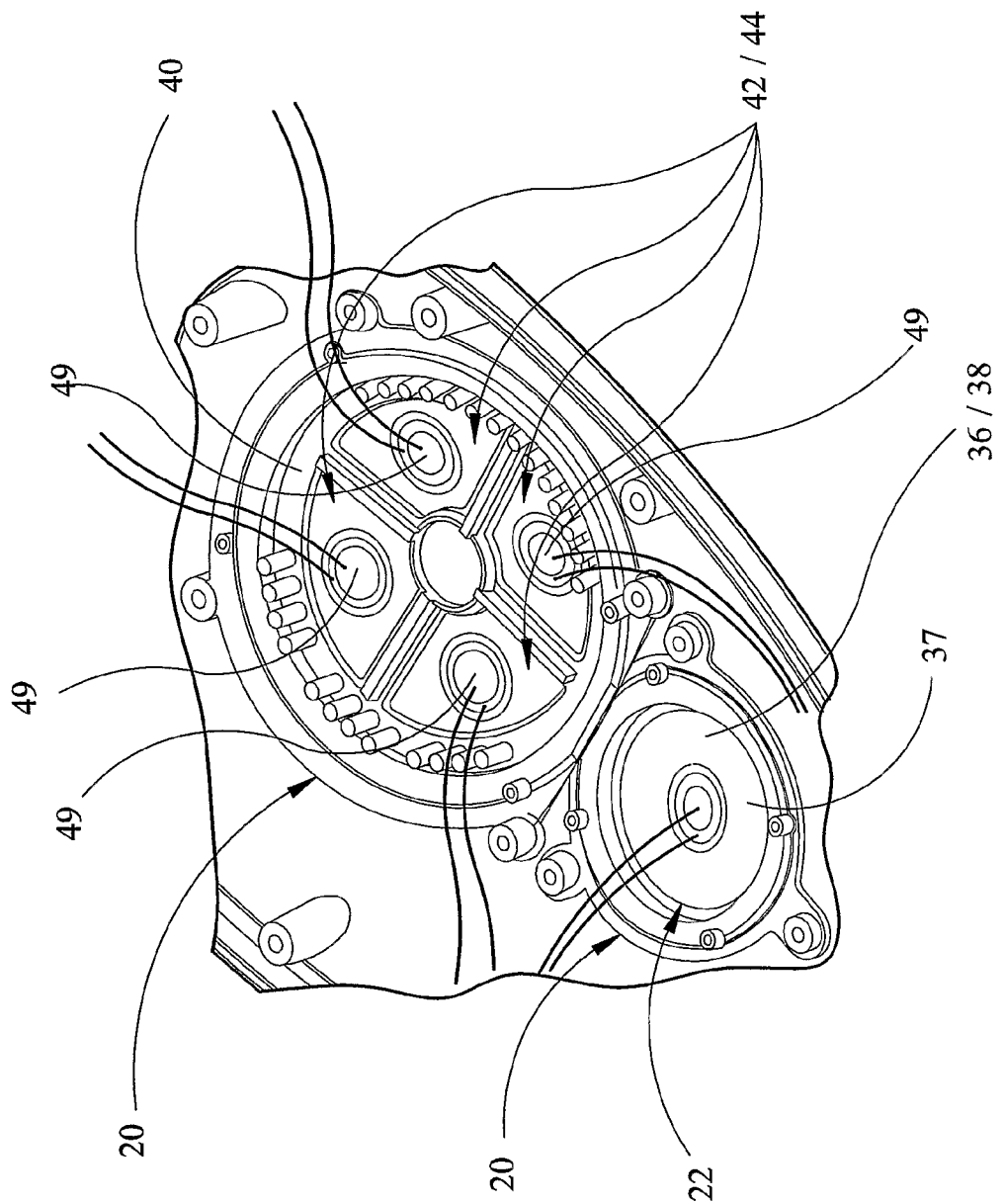
FIG. 8 is a perspective view from inside the top cover of the electric shower water heater unit, shown in FIG. 4a with circuit board components removed to show the rear surfaces of the control panel and power button.

The power button 22 has a deformable surface 36 with a switch 37 mounted on the rear surface 38 (FIGS. 5, 6 and 8). The control panel 24 has a continuous and deformable surface 40 which is divided into four quadrants 42, relating to increase and decrease of water flow rate, and increase and decrease of water temperature (FIGS. 7 and 8). A switch 49 is mounted on the rear surface 44 of each quadrant 42.

The switches mentioned above are pressure sensitive devices. Conveniently, these can be piezo-electric devices which are selectively deformed as the power button 22 and/or control panel 24 is pressed by a user, depending on the pressure imparted by the touch of a user at a particular location.

Figure 9:
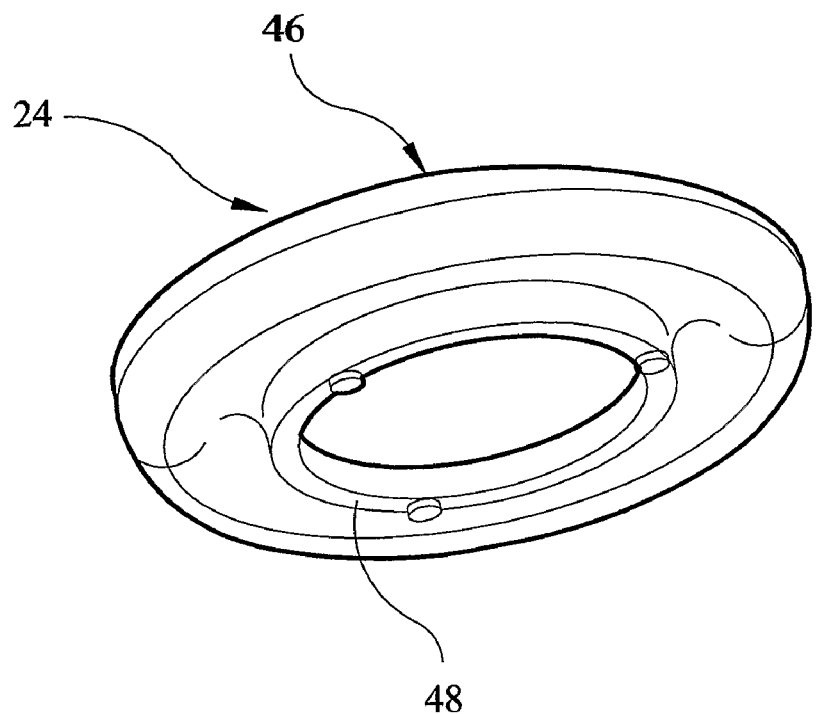
FIG. 9 is a perspective view from below of a power button light guide within the electric shower water heater unit.
Figure 10:
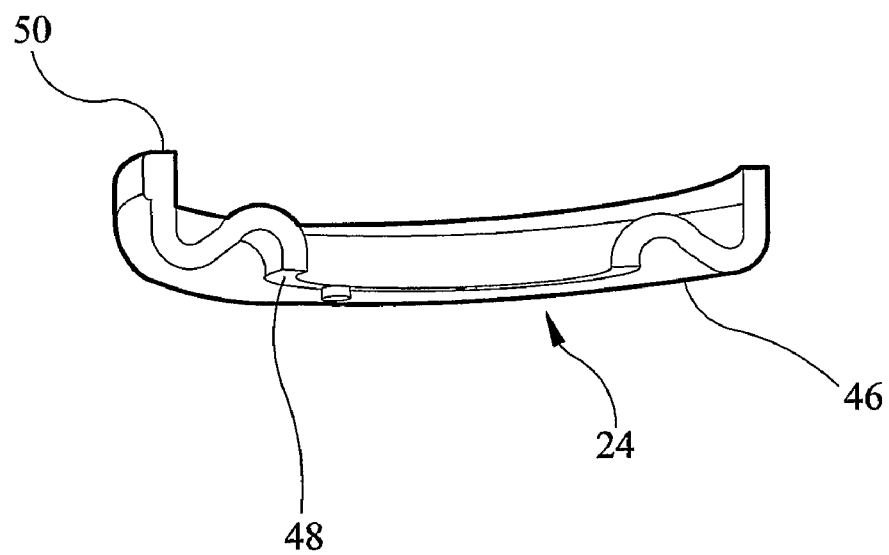
FIG. 10 is a cross-sectional view of the power button light guide.

Within the power button 22 is located a convoluted profile light-guide 46 as shown in FIGS. 6, 9 and 10. One or more light emitting elements, such as LEDs 146, are provided at or adjacent to an inwardly facing edge 48, and once the power button 22 is pressed to energise the electric shower unit 10, light is transmitted via internal reflection to an outwardly facing edge 50 of the guide 46, thus more clearly defining the position of the user-operable controller 20.

The base 14 includes an electric water heater 52 mounted thereon, a water flow control valve 54, a two part electrical connector 56 for connecting the shower unit 10 to a mains electricity supply cable (not shown), a rotatable water supply inlet 58 which may face upwardly, downwardly or in towards the mounting surface, is connected to the electric water heater 52 during installation, a shower water outlet 60 to which a shower hose (not shown) can be connected, and a control circuit 62 mounted on a PCB 64. The various other components provided on the base 14 are typical to electric shower units, and will thus not be described in detail.

Figure 15:
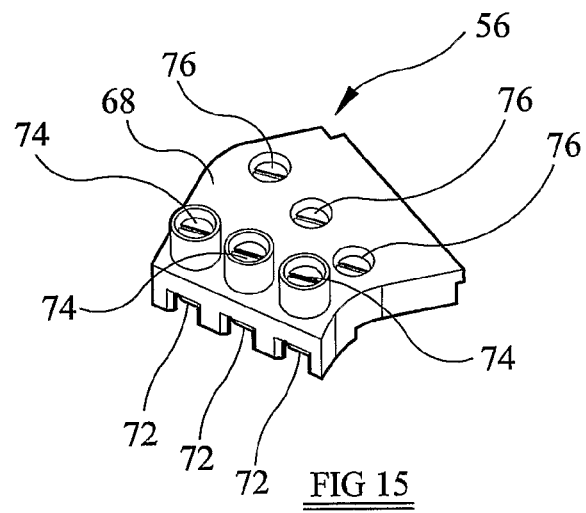
FIG. 15 is a perspective view of a top part of a two part electrical connector of the electric shower water heater unit.
Figure 16:
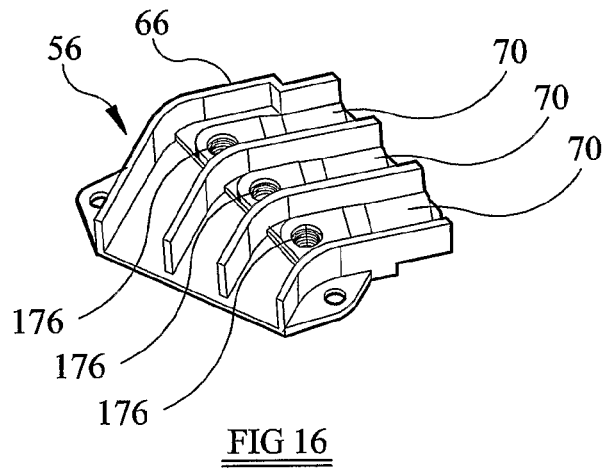
FIG. 16 is a perspective view of a base part of the two part electrical connector.
Figure 17:
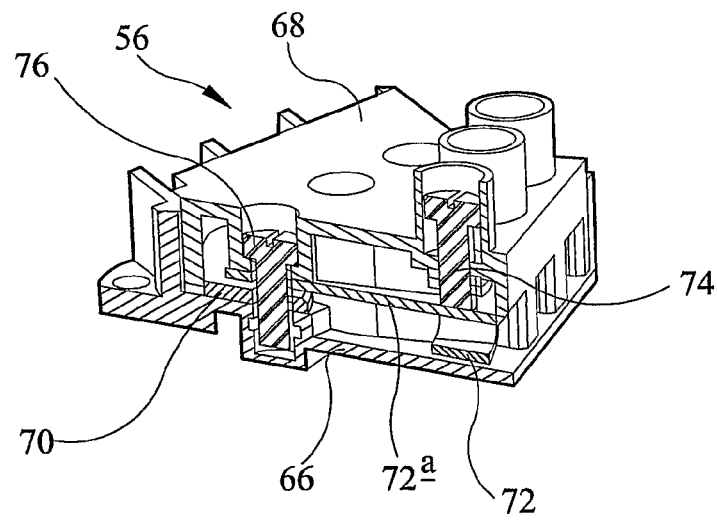
FIG. 17 is a sectional perspective view of the two part connector, showing the top part and the base part substantially fully engaged.
Figure 18:
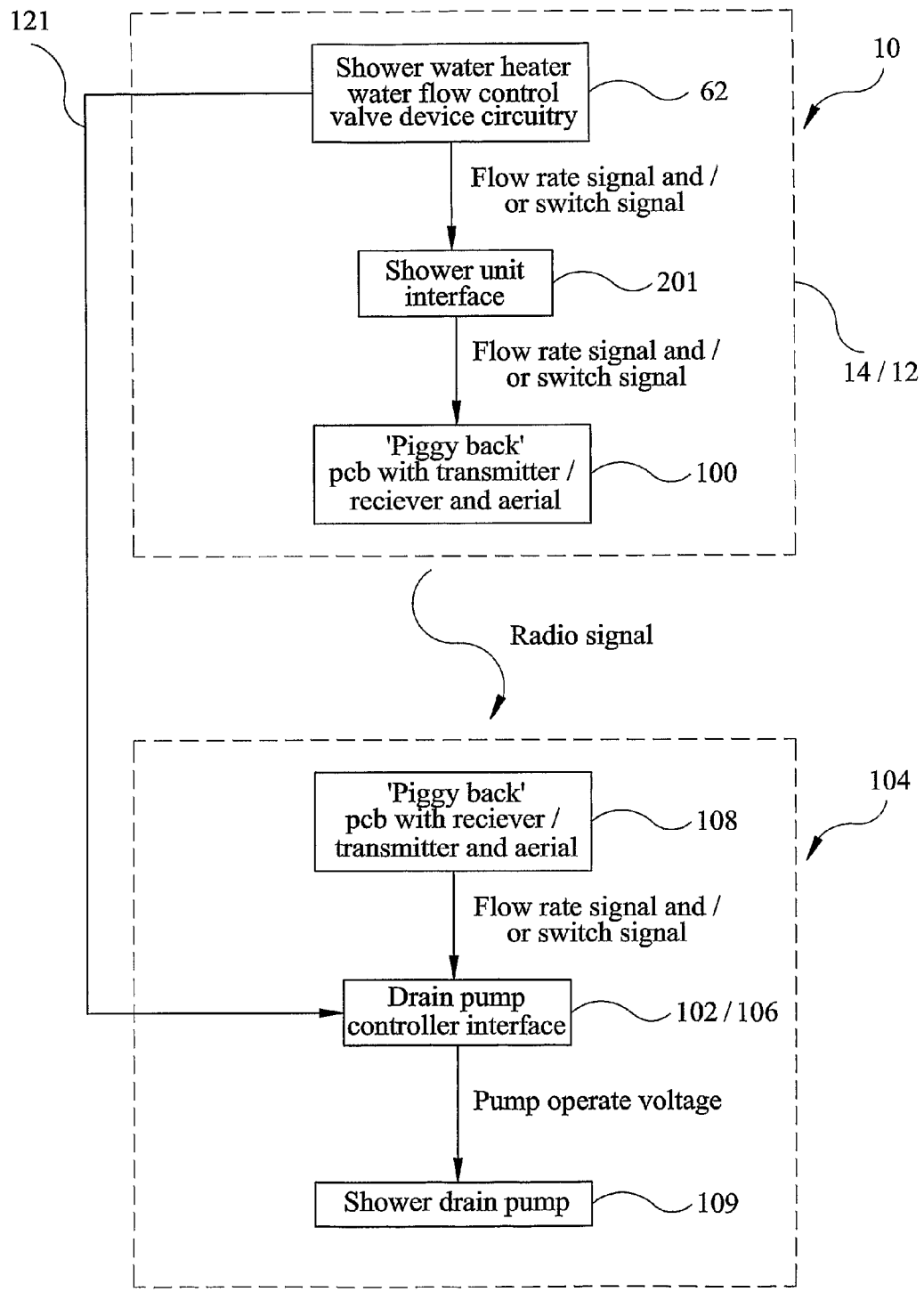
FIG. 18 is a diagrammatic representation showing an optional transmitter connected to a shower control circuit of the electric shower water heater unit, shown in FIG. 1, and an optional receiver connected to a pump control circuit of a pumped waste water outlet unit connected to a drain, together with a direct wire connection between shower control circuit and pump control circuit.

The two part electrical connector 56 (FIGS. 15 to 17) provides electricity from a mains electricity supply to the electric water heater 52 and control circuit 62, and includes a plastics base part 66 which is fixed to the base 14 of the housing 12 and which is in electrical communication with the electric water heater 52, a plastics top part 68 which is connectable to cable conductors of the mains power supply cable and which is releasably engagable with the base part 66, and metal connector conductors 70, 72a via which, when the top part 68 and base part 66 are engaged, the top part 68 and base part 66 can electrically communicate.

The base part 66 and top part 68 are substantially planar, and include a crank by which correct alignment and orientation of the two parts 66, 68 is assured. Three of the connector conductors 70 extend in parallel or substantially parallel with each other, and are supported by the base part 66.

The top part 68 of the electrical connector 56 includes three cable conductor clamps 72 for clamping the cable conductors of the mains power supply cable to the conductors 72a within the top part 68 of the electrical connector 56. The cable conductor clamps 72 include screw-threaded fasteners 74, and are in electrical communication with the connector conductors 72a.

Figure 4:
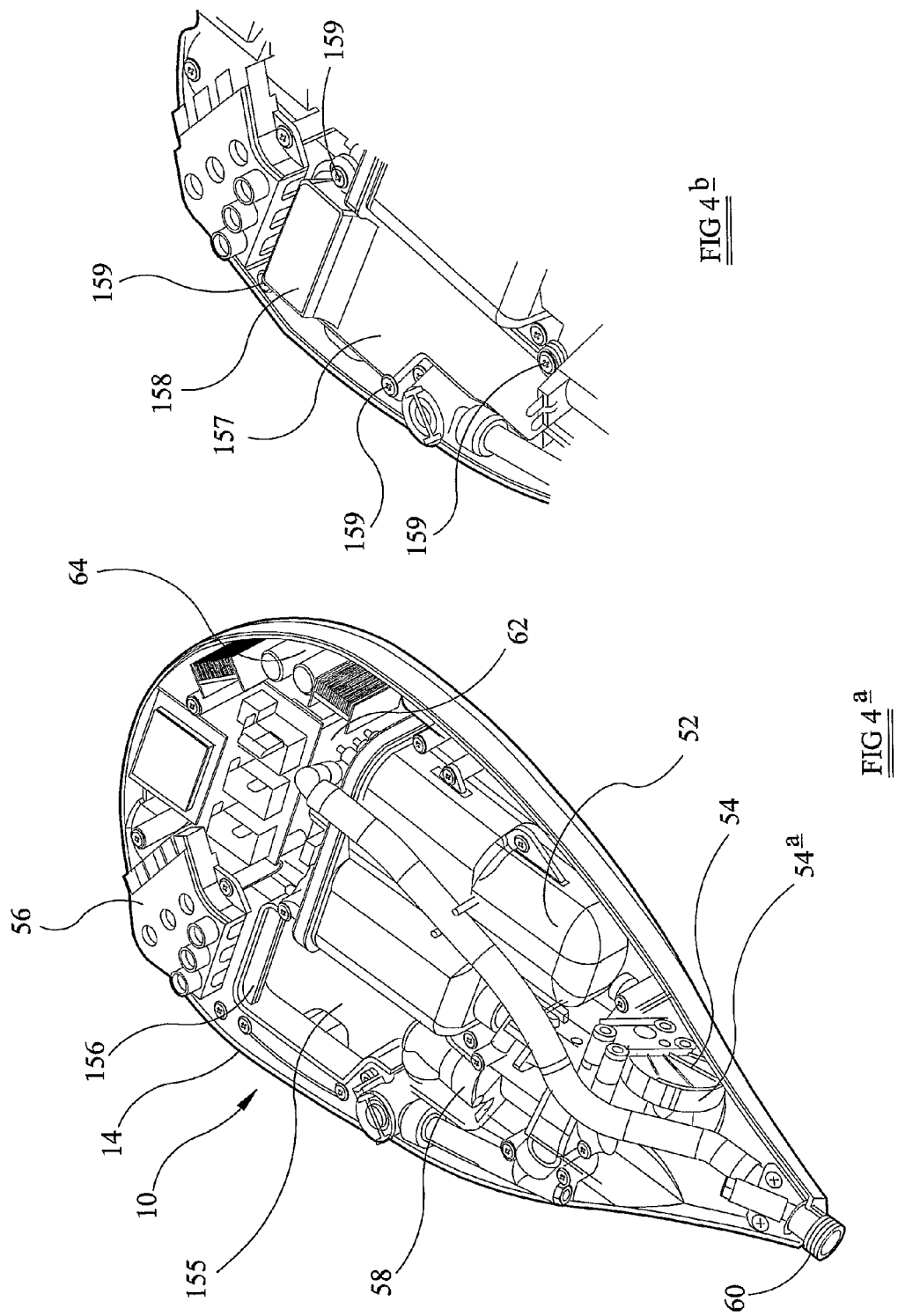
FIG. 4a is a perspective view of a base of the electric shower water heater unit, shown in FIG. 1 with a cable sealing cover removed.
FIG. 4b is a scrap perspective view of the base of the electric shower water heater unit shown in FIG. 4a with the cable sealing cover in position.

During installation of the electric shower unit 10, the mains electricity supply cable is typically passed through the mounting wall immediately behind the base 14 of the housing 12, in the region of the service installation area 155 as shown in FIG. 4a. This is immediately below a water-tight cover 157 (FIG. 4b) with an integrated cable sealing gland region 158, which is held in place by threaded fixings 159. The electrical cable is passed through opening 155 with the cover 157 removed, and the top part 68 of the electrical connector 56 is removed and the cable conductors of the mains electricity supply cable are clamped in the cable conductor clamps 72. The top part 68 is then fastened with further screw-threaded fasteners 76 to the base part 66 with captive fasteners 176, thus allowing current flow through electrical connector 56. This action allows a simple cable bending action to be made on the electrical cable, rather than the heretobefore difficult and high force action of moving the conductors along their axes to allow them to be inserted into the conductor clamps. The cover 157 is then reinstated using threaded fasteners 159 to establish a water-tight seal around the electrical cable where it now passes into the casing 12.

The electrical connector 56 simplifies installation of the electric shower unit 10, and allows the base 14 of the housing 12 to be mounted to a surface without fear of access to a connection point for the mains electricity supply cable being obscured.

The control circuit 62 controls the electric water heater 52 and the water flow control valve 54 based on user inputs received via the user-operable controller 20. In particular, the touch-pressure sensitive devices of the user-operable controller 20 are connected to the control circuit 62, and the control circuit 62 includes electronic logic and digital filtering to determine when a specific command has been received. For example, if a partially sighted user runs their finger over the control panel 24 or water spray is directed to directly impinge on the user-operable controller 20, pressure is inherently imparted to one or more of the pressure sensitive devices. Although the pressure sensitive device outputs a signal to the control circuit 62, the actual signal outputted is pressure dependent. Consequently, the control circuit 62 filters the signal. If a signal corresponding to a predetermined value is not received, then the control circuit 62 determines that control of the water temperature or flow rate should not occur. However, if a signal which equals or exceeds the predetermined value is received, then it is determined that control of the water temperature or flow rate should occur, and the control circuit 62 controls the electric water heater 52 and/or water flow control valve 54 accordingly. Consequently, a two-stage response is possible.

It is envisaged that an audible output circuit 207 can be provided so that, in the event that a user touches the user-operable controller 20 lightly while trying to determine the layout of the controls, then, if the predetermined value of pressure is not detected, the control circuit 62 only controls the audible output circuit to output an audible indication corresponding to the quadrant 42 or power button 22 pressed by the user. If a pressure signal which equals or exceeds the predetermined value of pressure is received by the control circuit 62, then an audible indication can be outputted in addition to control of the water temperature and/or water flow rate.

Referring to FIG. 11 to 14, the electric water heater 52 comprises an insulated water heater housing 78 having a water inlet 80, a first heating chamber 82 in the housing 12 and into which the water inlet 80 only discharges water, a second heating chamber 84 adjacent to the first heating chamber 82, an elongate conduit 86 which, in use, extends vertically or substantially vertically in the housing 12 and which fluidly interconnects the first and second heating chambers 82, 84, and a water outlet 88 in a top of the water heater housing 78 through which water flows from the second heating chamber 84, out of the electric water heater 52, and to the shower water outlet 60 of the electric shower unit 10.

The first heating chamber 82 has a smaller volume than the second heating chamber 84, and each heating chamber 82, 84 includes an electric, typically coiled, heating element 90. Coiled heating elements 90 are particularly advantageous, since a diameter of the coils can be made close to a lateral dimension of the heating chambers 82, 84, in order to promote a large contact area and thus faster heating of water.

Although the heating elements 90 are independent of each other, they can be formed integrally.

The elongate conduit 86 includes a first opening 92 at or adjacent to its upper end, and a second opening 94 at or adjacent to its lower end. The first opening 92 defines a first heating chamber outlet for water to flow from the first heating chamber 82 and into the elongate conduit 86. The second opening 94 defines a second heating chamber inlet for water to flow from the elongate conduit 86 and into the second heating chamber 84.

The top of the water heater housing 78 is formed as a removable cover 96 to allow access to the interiors of the first and second heating chambers 82, 84. The cover 96 is water-tightly sealable to the housing 78 via a plurality of snap-fittable clips 98. The heating elements 90 are mounted to extend through the cover 96, and are thus also supported in spaced relationship by the cover 96.

It will be understood that non-coiled heating elements can be utilised.

The use of two heating chambers 82, 84 enables a very compact water heater 52 to be formed which can quickly and efficiently heat a relatively large volume of water.

The above described electric shower water heater unit 10, although intended to provide a gravity feed of water to the shower water outlet 60 of the housing 12, and thus an attached shower head, can include an electric pump provided within the housing 12 and operated by the control circuit 62 in conjunction with commands received from the user-operable controller 20.

The electric shower water heater unit 10 of the present invention is intended to be used in combination with a waste water outlet unit (not shown), which may be trapped or untrapped, and pumped or gravity operated. In the case of a pumped waste water outlet unit, an electric pump is utilised to draw waste water from the waste water outlet unit and to pump to a drain. Pumped waste water outlet units are well known in the art, but such units either require sensors for detecting the presence of waste water in the waste water outlet unit, or require a physical electrical connection to the shower unit so that the pump is activated when the shower unit is energised. Such connection has been a simple on-off switch connection.

The control circuit 62 of the above described electric shower water heater unit includes additional PCBs (FIG. 19) located in the top cover 12 and interconnected by multi-core cables (not shown). The additional PCBs in the top cover 12 provide interface connectors blocks 204 to permit accessories such as additional control facilities to be added at manufacture or as purchased accessories. Interface PCB 206 formats with connectors 205 to mutually cooperate with opposite gender connector blocks 200, 204 to provide electrical connections between interface PCBs 206, 201,207 and primary PCBs 202, 203, 164.

The control circuit 62 of the above described electric shower water heater unit 10 includes a transmitter interface 200, by which an optional transmitter circuit 100 on PCB 201 can be demountably connected to the control circuit 62, typically via mounting on the connector blocks 200 on the Printed Circuit Board 202 located within the unit case. In this case, the transmitter 100 outputs a, typically radio frequency, signal when the control circuit 62 initially operates the water flow control valve 54 to provide water flow to the shower water outlet 60.

The radio frequency signal emitted by the transmitter 100 may beneficially be of a form to include water flow rate information from the shower, allowing the receiving circuitry on the shower drain pump to control the voltage applied and hence speed of the water drain pump 104 to match that of the flow rate of water through the shower flow valve 54. In this case, means for determining water flow rate, for example being a water flow rate sensor, is included to provide the required water flow rate information. Preferably, the water flow rate sensor is conveniently incorporated into the water flow control valve 54, and is referenced at 54*a* in FIG. 4*a*.

In the absence of, or in addition to, for example, as a backup facility, the wireless transmitter and receiver facility the water flow rate signals and any other information can be communicated between the shower water heater unit electrics 62 and the pump control circuit 102/106 by a direct wire link 121.

Similarly, a control circuit 102 of the pump 104 of the waste water outlet unit includes a receiver interface on a pump control circuit 106 on a PCB by which an optional receiver 108 can be demountably connected to the pump control circuit 102 using mutually cooperating connectors. In the case of the provision of flow sensors in the waste water outlet unit, the provision of the receiver 108 overrides the unction of the sensors.

In use, the transmitter 100 outputs a signal to the receiver 108, either when water flow from the electric shower water heater unit 10 is initiated, or when the power button 22 is pressed ON. The receiver 108 receives the signal, which may also beneficially convey information on the water flow rate through the shower via the water flow rate sensor 54a, and the pump control circuit 102 energises the pump 104, either immediately or following a predetermined delay. Such energisation may be a simple on-off control or if the signal provides the flow rate data, be proportional to or based on the water flow rate through the shower 10. Once water flow from the electric shower water heater unit 10 is halted, the transmitter 100 outputs an appropriate signal, or halts the signal, and the pump control circuit 102 deenergises the pump 104, either immediately or following a predetermined interval.

Wireless communication between the electric shower water heater unit 10 and the pump 104 of the waste water outlet unit is particularly beneficial during installation, since physical wiring between the electric shower unit 10 and the waste water outlet unit, and between the flow sensors and the control circuit 102 of the pump, can be dispensed with, thus resulting in a quick and easy system to install.

Figure 21:
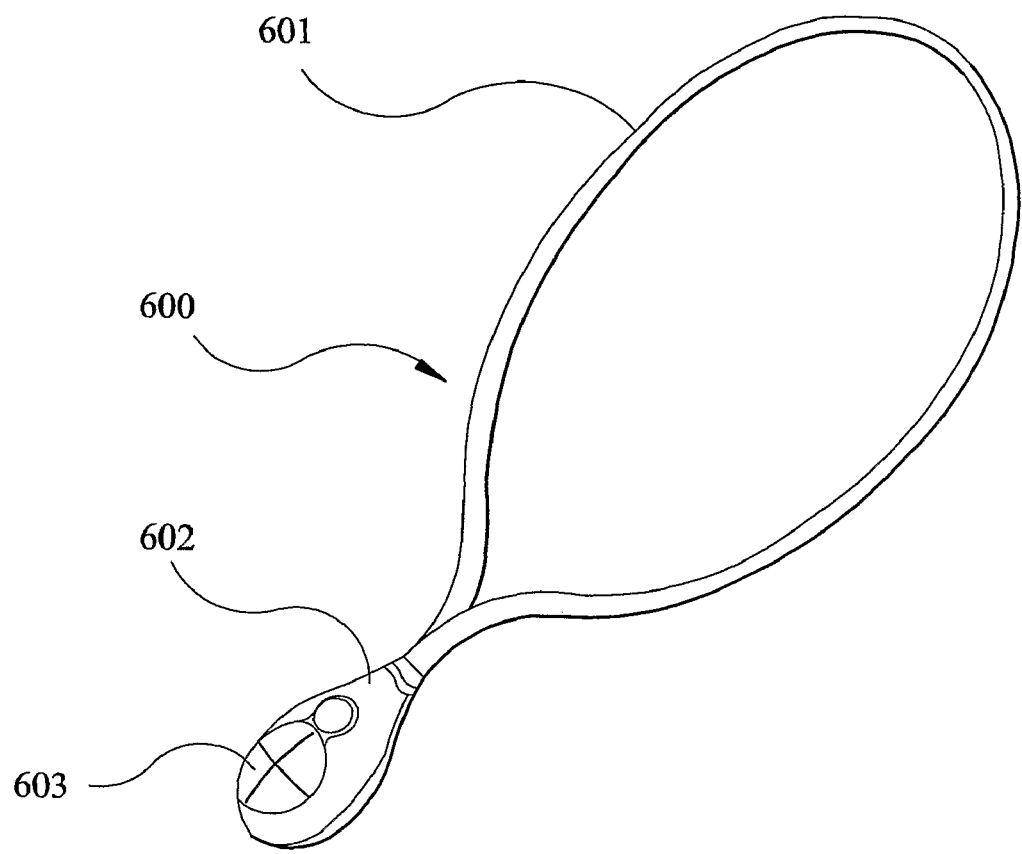
FIG. 21 is a perspective view of a personal wireless remote control unit.

Referring to FIG. 21, the user-operable controller can be or include a watertight handheld or personal wireless remote control unit 600, such as a necklace 601 and pendent 602. This is particularly advantageous in that a seated person or attendant can easily access, operate and control the electric shower water heater unit 10 remotely. A user interface 603 of the remote control unit can be a replica of, or substantially identical to, the user-operable controller 20 provided on the housing 12 of the electric shower unit 10, so that a user does not become confused with operation. It is feasible that user-operable controller 20, control panel 24 and/or power button 22 can therefore be electronically disabled or dispensed with entirely.

The remote control unit can be permanently wall mounted at a convenient location for the user, but spaced from the electric shower water heater unit 10.

If the remote control unit is unlikely to be exposed to direct water contact, then the unit need not be watertight.

In the case of a remote control unit, an appropriate receiver is provided within the housing 12, connected to the shower control circuit 62.

It is thus possible to provide an electric shower water heater unit which meets the needs of the disabled and or infirm, which is easy to operate, and which is straightforward to install.

The embodiment described above is given by way of example only, and various other modifications will be apparent to persons skilled in the art without departing from the scope of the invention, as defined by the appended claims.

The invention claimed is:

1. An electric shower water heater unit for connection to a water supply and a mains electricity supply, the water heater unit comprising a housing having a shower water outlet to which a shower hose is connected or connectable; an electric water heater which is housed in the housing and which is fluidly connected or connectable to a water supply outlet of the water supply and electrically connected or connectable to the mains electricity supply, the electric water heater supplying water to the shower water outlet of the housing; a user-operable controller for controlling a temperature and a flow rate of water supplied to the shower water outlet of the housing, and a control circuit which is housed in the housing and which controls the electric water heater based on inputs received from the user-operable controller; the user-operable controller including a touch-pressure sensitive element for pressing by a user and which is in communication with the control circuit, the control circuit only controlling the electric water heater when a pressure imparted by a user pressing the touch-pressure sensitive element is equal to or greater than a predetermined value, and further comprising an audio output circuit so that, when the pressure imparted by a user touching the touch-pressure sensitive element is less than the predetermined value, the control circuit controls the audio output circuit to output an audible indication corresponding to a function associated with the touch-pressure sensitive element.

2. An electric shower water heater unit as claimed in claim 1, wherein the user-operable controller includes two said touch-pressure sensitive elements, one for outputting a signal to the control circuit to increase the temperature of the water supplied to the shower water outlet, and the other for outputting a signal to the control circuit to decrease the temperature of the water supplied to the shower water outlet.

3. An electric shower water heater unit as claimed in claim 1, wherein the user-operable controller includes two or two further said touch-pressure sensitive elements, one for outputting a signal to the control circuit to increase the flow rate of the water supplied to the shower water outlet, and the other for outputting a signal to the control circuit to decrease the flow rate of the water supplied to the shower water outlet.

4. An electric shower water heater unit as claimed in claim 1, wherein the or each touch-pressure sensitive element is a piezo-electric device which is in electrical communication with the control circuit.

5. An electric shower water heater unit as claimed in claim 1, wherein the control circuit includes digital filters for distinguishing between intended pressure imparted by direct contact from the user with the user-operable controller, and undesired pressure imparted by accidental contact from the user with the user-operable controller or shower water contacting the user-operable controller.

6. An electric shower water heater unit for connection to a water supply and a mains electricity supply, the water heater unit comprising a housing having a wall mountable base and cover which is releasably engagable with the base; an electric water heater housed in the housing and connected or connectable to a water outlet of the water supply; a control circuit for controlling the electric water heater; and a two part electrical connector for supplying electricity to the electric water heater and the control circuit, the electrical connector having a base part which is provided in the housing and which is in electrical communication with the electric water heater and the control circuit, a top part which is connectable to cable conductors of a mains power supply cable and which is releasably engagable with the base part, and connector conductors via which, when the top part and base part are engaged, the top part and base part can electrically communicate, so that the electric water heater can be energised and controlled.

7. An electric shower water heater unit as claimed in claim 6, wherein the base part of the electrical connector is held stationary within the housing.

8. An electric shower water heater unit as claimed in claim 6, wherein the base part and the top part of the electrical connection include complementary cranks to prevent misalignment.

9. An electric shower water heater unit as claimed in claim 6, wherein the connector conductors extend in parallel or substantially parallel with each other.

10. An electric shower water heater unit as claimed in claim 6, wherein the top part includes cable conductor clamps for clamping the cable conductors of the mains power supply cable to the top part of the electrical connector, the cable conductor clamps being in electrical communication with the connector conductors.

11. An electric shower water heater unit as claimed in claim 10, further comprising screw threaded fasteners for releasably engaging the top part and the base part of the electrical connector, the screw threaded fasteners being in electrical communication with the connector conductors.

* * * * *